(12) United States Patent
Kasa

(10) Patent No.: US 11,841,331 B2
(45) Date of Patent: Dec. 12, 2023

(54) MEASURING AND CALCULATING APPARATUS AND MEASURING AND CALCULATING PROGRAM

(71) Applicant: Kioxia Corporation, Tokyo (JP)

(72) Inventor: Kentaro Kasa, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 26 days.

(21) Appl. No.: 17/544,985

(22) Filed: Dec. 8, 2021

(65) Prior Publication Data
US 2022/0404292 A1 Dec. 22, 2022

(30) Foreign Application Priority Data
Jun. 17, 2021 (JP) ................. 2021-100743

(51) Int. Cl.
*G01N 21/956* (2006.01)
*G01N 21/95* (2006.01)

(52) U.S. Cl.
CPC ... *G01N 21/95607* (2013.01); *G01N 21/9501* (2013.01); *G01N 2021/95615* (2013.01)

(58) Field of Classification Search
CPC .................................................. G01N 21/9501
See application file for complete search history.

(56) References Cited

U.S. PATENT DOCUMENTS

| | | | |
|---|---|---|---|
| 8,294,907 B2 * | 10/2012 | Cramer | G01N 21/47 356/625 |
| 10,481,506 B2 | 11/2019 | Bozkurt et al. | |
| 2010/0296068 A1 * | 11/2010 | Shibazaki | G01N 21/94 355/30 |
| 2010/0321654 A1 * | 12/2010 | Den Boef | G03F 7/70633 355/53 |
| 2020/0073254 A1 | 3/2020 | Van Der Schaar et al. | |
| 2023/0244151 A1 | 8/2023 | Van Haren et al. | |

FOREIGN PATENT DOCUMENTS

| | | | | |
|---|---|---|---|---|
| CN | 110914965 A | * | 3/2020 | ......... G01N 21/8806 |
| JP | 2008098636 A | * | 4/2008 | ............. G01N 21/47 |
| JP | 2017215429 A | | 12/2017 | |
| JP | 2018526674 A | | 9/2018 | |
| JP | 2020519928 A | | 7/2020 | |
| WO | WO-2009063295 A1 | * | 5/2009 | ........... G01N 21/956 |

* cited by examiner

*Primary Examiner* — Tarifur R Chowdhury
*Assistant Examiner* — Kemaya Nguyen
(74) *Attorney, Agent, or Firm* — Holtz, Holtz & Volek PC

(57) ABSTRACT

A measuring and calculating apparatus to measure and calculate a positional displacement amount of a pattern on a surface of a target object. The apparatus includes: a measuring unit to measure a first two-dimensional intensity distribution of a first diffracted light and a second two-dimensional intensity distribution of a second diffracted light; a storage unit to store a first and a second measurement data respectively indicating the first and the second two-dimensional intensity distribution; and an arithmetic unit to execute arithmetic processing using the first and the second measurement data to acquire difference data between the first and the second measurement data, and calculate a positional displacement amount of a difference pattern between the first and second patterns in accordance with the difference data.

6 Claims, 15 Drawing Sheets
(4 of 15 Drawing Sheet(s) Filed in Color)

MEASURING AND CALCULATING APPARATUS AND MEASURING AND CALCULATING PROGRAM

CROSS-REFERENCE TO RELATED APPLICATIONS

This application is based upon and claims the benefit of priority from Japanese Patent Application No. 2021-100743, filed on Jun. 17, 2021; the entire contents of which are incorporated herein by reference.

FIELD

Embodiments relate to a measuring and calculating apparatus and a measuring and calculating program.

BACKGROUND

In order to further increase a capacity of a memory, a semiconductor device such as a memory having a three-dimensional structure has been developed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
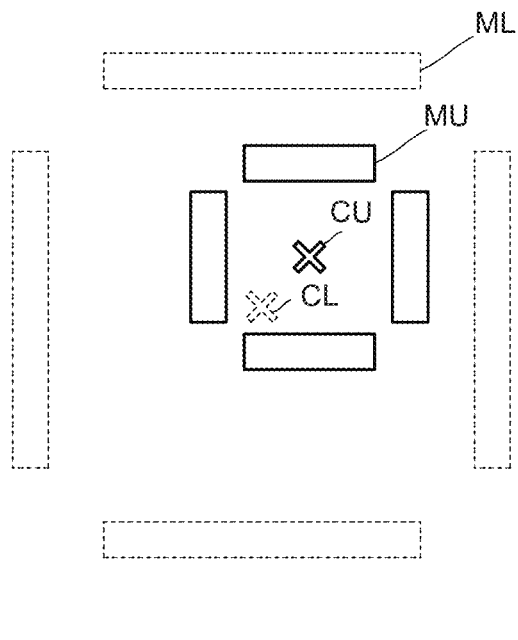
FIG. 1 is a schematic plan view for explaining an example of a conventional measuring and calculating method of a pattern positional displacement amount.

Embodiments will be hereinafter described with reference to the drawings. In the drawings, the relation of thickness and planer dimension of each constituent element, a thickness ratio among the constituent elements, and so on may be different from actual ones. Further, in the embodiments, substantially the same constituent elements are denoted by the same reference signs, and a description thereof will be appropriately omitted.

A semiconductor device such as a memory having a three-dimensional structure is manufactured by performing processing on a structure having a plurality of layers to form patterns such as a circuit pattern and a device pattern. These patterns can be formed by using, for example, a photolithography technique. In a case where a lower layer pattern is formed in a first process and an upper layer pattern is formed in a subsequent process in accordance with a position of the lower layer pattern, if an alignment accuracy between the lower layer pattern and the upper layer patterns is low, a manufactured semiconductor device sometimes does not operate normally. Accordingly, it has been known to measure and calculate a positional displacement amount of a formed pattern to adjust a position of the pattern.

FIG. 1 is a schematic plan view for explaining an example of a conventional measuring and calculating method of a pattern positional displacement amount. FIG. 1 illustrates alignment marks ML of a lower layer pattern, and alignment marks MU of an upper layer pattern. In the example of the conventional measuring and calculating method of the pattern positional displacement amount, the alignment marks ML of the lower layer pattern and the alignment marks MU of the upper layer pattern are formed, and after forming the upper layer pattern, a center distance between a center CL of the alignment marks ML and a center CU of the alignment marks MU is optically measured and calculated, to thereby calculate the pattern positional displacement amount.

Figure 2:
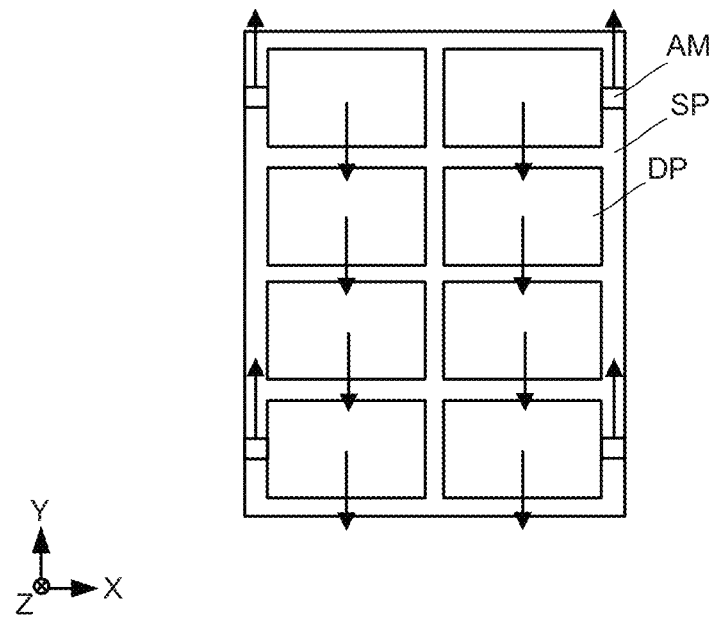
FIG. 2 is a schematic plan view illustrating an example of pattern layout.

Such alignment marks are difficult to be formed in a region same as that of a circuit pattern and a device pattern. FIG. 2 is a schematic plan view illustrating an example of pattern layout. FIG. 2 illustrates alignment marks AM, device patterns DP, and a scribe pattern SP. As illustrated in FIG. 2, when the alignment mark AM is formed in a region different from that of the device pattern DP, a direction of positional displacement of the alignment mark AM is sometimes different from a direction of positional displacement of the device pattern DP, as indicated by arrow marks in FIG. 2. Accordingly, if a positional displacement amount of the device pattern DP is calculated by using the alignment mark AM, a positional displacement amount having a value different from that of the actual displacement amount of the device pattern DP is calculated. Therefore, a measuring and calculating apparatus capable of measuring and calculating a positional displacement amount of a desired pattern with a high calculation accuracy has been demanded.

Figure 3:
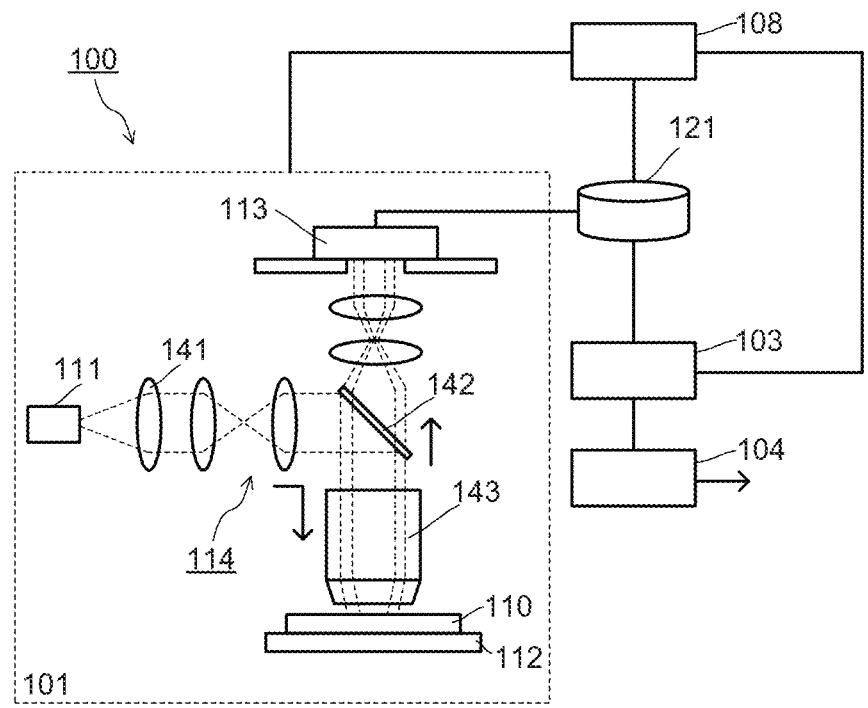
FIG. 3 is a schematic view illustrating a configuration example of a measuring and calculating apparatus 100.
Figure 4:
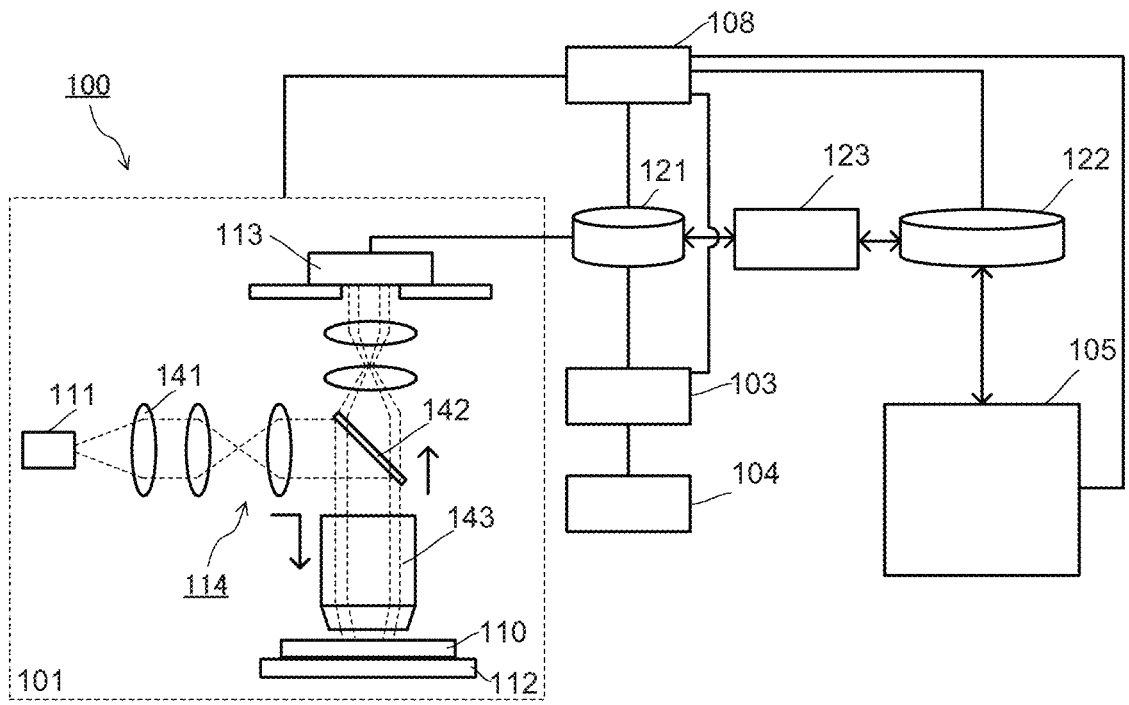
FIG. 4 is a schematic view illustrating a configuration example of a measuring and calculating apparatus 100.

Next, a measuring and calculating apparatus of an embodiment will be described. Each of FIG. 3 and FIG. 4 is a schematic view illustrating a configuration example of a measuring and calculating apparatus 100. The measuring and calculating apparatus 100 has a function of measuring and calculating a positional displacement amount of a pattern formed on a target object 110. The measuring and calculating apparatus 100 includes a measuring unit including a measuring device 101, a storage unit including a storage device 121, an arithmetic unit including an arithmetic device 103, an output unit including an output device 104, and a control unit including a control device 108. The measuring unit, the storage unit, the arithmetic unit, the output unit, and the control unit may be provided in one apparatus, or they may also be provided in a plurality of different apparatuses to configure a measuring and calculating system.

The measuring device 101 can measure an intensity distribution of diffracted light generated by applying light to the target object 110. The measuring device 101 has a light source 111, a stage 112, an imaging device 113, and an optical system 114.

The light source 111 can apply light. Examples of the light source 111 include a xenon lamp.

The stage 112 has a surface for placing the target object 110 thereon. The stage 112 can operate in an X-axis direction, a Y-axis direction, and a Z-axis direction, and the stage 112 is scanned on an X-Y plane to move the target object 110 with measuring the target object 110.

The imaging device 113 can measure a two-dimensional intensity distribution of diffracted light generated by applying light to the target object 110. The diffracted light includes lights which are incident at different positions such as 0-th order light, first-order light, and second-order light, so that by using a plurality of two-dimensional detectors arranged on the X-Y plane, as the imaging device 113, it is possible to measure the two-dimensional intensity distribution. Examples of the two-dimensional detector include image sensors such as a Charge Coupled Device (CCD) sensor and a CMOS sensor.

The optical system 114 has a function of leading the light from the light source 111 to the target object 110, and a function of leading the diffracted light generated by applying light to the target object 110, to the imaging device 113. The optical system 114 illustrated in each of FIG. 3 and FIG. 4 has a plurality of condensing lenses 141, a beam splitter 142, and an objective lens 143, but the configuration of the optical system 114 is not limited to the configuration illustrated in each of FIG. 3 and FIG. 4.

The storage device 121 can store data (measurement data) indicating the two-dimensional intensity distribution of the diffracted light measured by the measuring device 101. The storage device 121 can further store a measuring program for executing a measuring operation by the measuring device 101, an arithmetic program for executing arithmetic processing by the arithmetic device 103, and a control program for controlling respective operations of the measuring device 101, the storage device 121, and the arithmetic device 103 by the control device 108. Examples of the storage device 121 include a hard disk drive, a solid state drive, and so on. The storage device 121 may also be provided in the measuring device 101.

The arithmetic device 103 can perform the arithmetic processing using a plurality of pieces of measurement data, and calculate a pattern positional displacement amount based on a result of the arithmetic processing. Examples of the arithmetic device 103 include a computer such as a personal computer. The arithmetic device 103 may also be provided in the measuring device 101.

The output device 104 can output data indicating the pattern positional displacement amount calculated based on the result of the arithmetic processing, to the outside. Examples of the output device 104 include a computer which reads a file storage program and performs processing in a central processing unit (CPU), and so on. The output device 104 may also be provided in the measuring device 101.

The control device 108 controls the respective operations of the measuring device 101, the storage device 121, and the arithmetic device 103. Examples of the control device 108 include a computer such as a personal computer. The control device 108 may also be provided in the measuring device 101.

The measuring and calculating apparatus 100 illustrated in FIG. 4 further includes a measuring device 105 and an external storage device 122.

The same configuration as that of the measuring device 101 can be applied to the measuring device 105. Accordingly, the explanation regarding the measuring device 101 can be appropriately cited for explanation regarding the measuring device 105. An operation of the measuring device 105 can be controlled by the control device 108, for example, but not limited to this, and it may also be controlled by a control device such as another computer.

The external storage device 122 is provided to the storage unit. The external storage device 122 can store data (measurement data) indicating a two-dimensional intensity distribution of diffracted light measured by the measuring device 105. Examples of the external storage device 122 include a hard disk drive, a solid state drive, and so on. An operation of the external storage device 122 can be controlled by the control device 108, for example, but not limited to this, and it may also be controlled by a control device such as another computer. The external storage device 122 may also be provided in the measuring device 105. The measurement data stored in the external storage device 122 can be sent to the storage device 121 via a data communication part 123 provided to the storage unit, for example. Examples of the data communication part 123 include a local area network (LAN), for example, and so on.

Next, an example of the target object 110 will be described. As an example, the target object 110 is a structure which is formed in the middle of manufacturing a semiconductor memory device.

Figure 5:
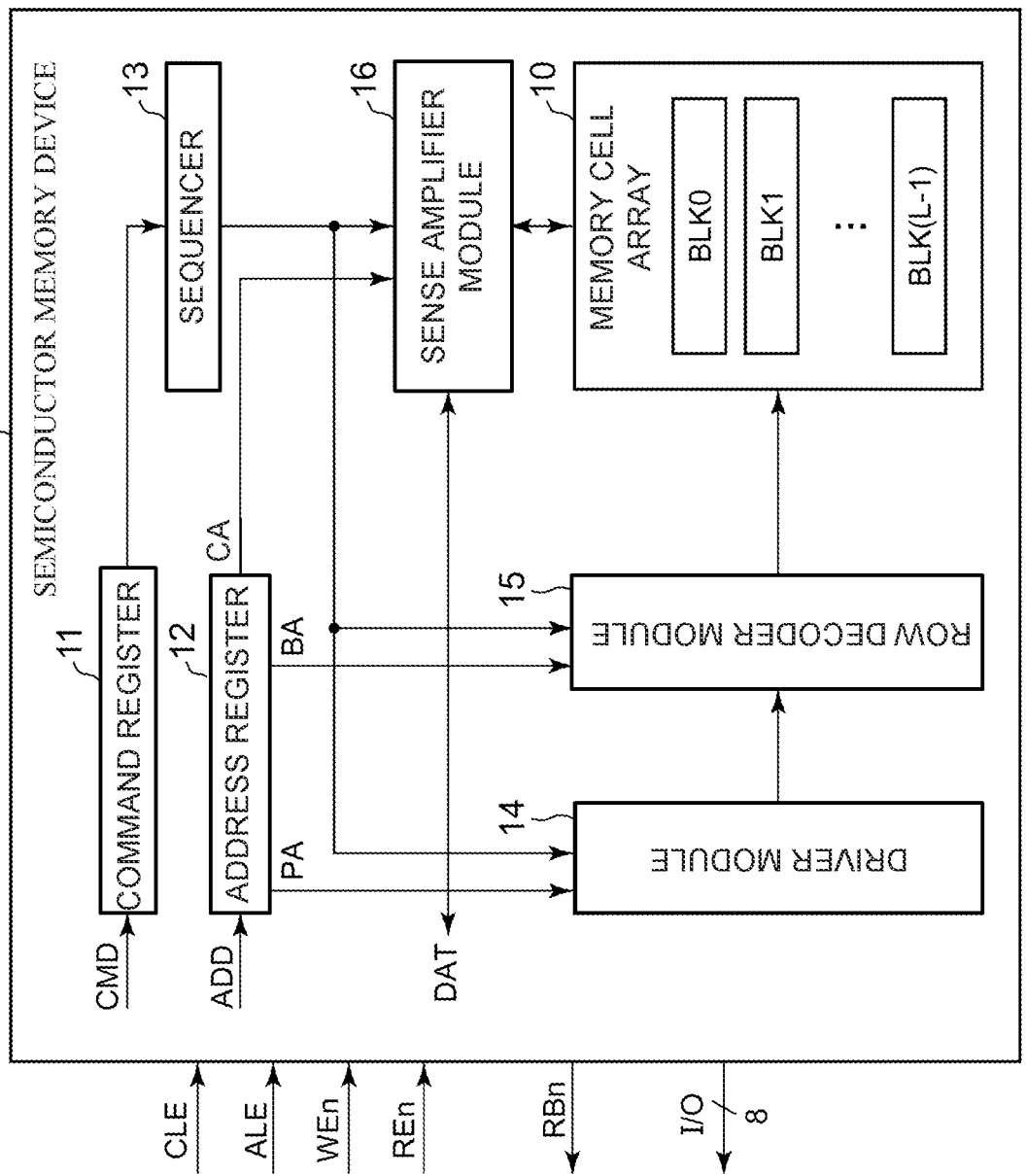
FIG. 5 is a block diagram illustrating an entire configuration of a semiconductor memory device.

First, an example of a semiconductor memory device will be described. FIG. 5 is a block diagram illustrating an entire configuration of the semiconductor memory device. A semiconductor memory device 1 is controlled by a memory controller, for example. The semiconductor memory device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLK(L−1) (L is an integer of 2 or more). Each of the blocks BLK is a set of a plurality of memory cell transistors (which will be described as "memory cells" in some cases hereinafter) which store data in a nonvolatile manner, and used as an erase unit of data, for example. The memory cell array 10 is provided with a plurality of bit lines and a plurality of word lines. The memory cell transistors are each related to one bit line and one word line, for example. A detailed configuration of the memory cell array 10 will be described later.

The command register 11 can hold a command CMD received by the semiconductor memory device 1 from the memory controller. The command CMD includes, for example, a command causing the sequencer 13 to execute a read operation, a write operation, an erase operation, and the like. The address register 12 can hold address information ADD received by the semiconductor memory device 1 from the memory controller. The address information ADD includes, for example, a block address BA, a page address PA, and a column address CA. For example, the block address BA, the page address PA, and the column address CA are used for selecting a block BLK, a word line, and a bit line, respectively.

The sequencer 13 controls the entire operation of the semiconductor memory device 1. For example, the sequencer 13 controls the driver module 14, the row decoder module 15, the sense amplifier module 16, and so on based on the command CMD held in the command register 11 to execute the read operation, the write operation, the erase operation, and so on.

The driver module 14 generates a voltage used for the read operation, the write operation, the erase operation, and so on. Further, the driver module 14 applies the generated voltage to a signal line corresponding to the word line selected based on the page address PA held in the address register 12, for example.

Based on the block address BA held in the address register 12, the row decoder module 15 selects a corresponding one of the blocks BLK in the memory cell array 10. Subsequently, for example, the row decoder module 15 transfers the voltage applied to the signal line corresponding to the selected word line, to the selected word line in the selected block BLK.

In the write operation, the sense amplifier module 16 applies a desired voltage to each bit line according to write data DAT received from the memory controller. Further, in the read operation, the sense amplifier module 16 determines data stored in the memory cell based on the voltage of the bit line or a current that flows through the bit line, and transfers the determination result as read data DAT to the memory controller.

The communication between the semiconductor memory device 1 and the memory controller supports the NAND interface, for instance. For example, in the communication between the semiconductor memory device 1 and the memory controller, a command latch enable signal CLE, an address latch enable signal ALE, a write enable signal WEn, a read enable signal REn, a ready/busy signal RBn, and an input/output signal I/O are used.

The command latch enable signal CLE is a signal indicating that an input/output signal I/O received by the semiconductor memory device 1 is a command CMD. The address latch enable signal ALE is a signal indicating that a signal I/O received by the semiconductor memory device 1 is address information ADD. The write enable signal WEn is a signal used for controlling data input from an input/ output signal I/O. The read enable signal REn is a signal used for controlling data output from an input/output signal I/O.

The ready/busy signal RBn is a signal that notifies the memory controller whether the semiconductor memory device 1 is in a ready state in which it accepts a command from the memory controller or is in a busy state in which it does not accept a command.

The input/output signal I/O is a signal with, for example, an eight-bit width, and can include the command CMD, the address information ADD, the data DAT, and so on.

A combination of the semiconductor memory device 1 and the memory controller explained above may form one semiconductor memory device. As such a semiconductor memory device, there can be cited, for example, a memory card such as an SD card, an SSD (Solid State Drive), and so on.

Figure 6:
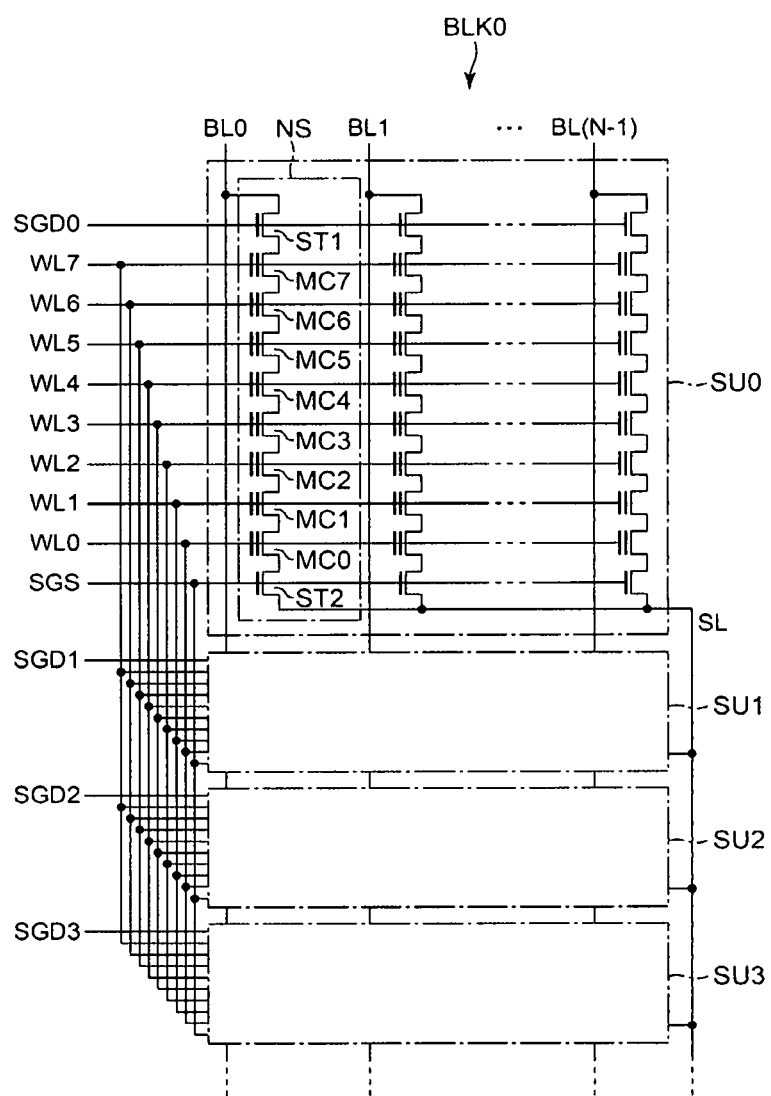
FIG. 6 is a view illustrating a circuit configuration example of a memory cell array 10.

Next, a circuit configuration of the memory cell array 10 will be explained while using FIG. 6. FIG. 6 illustrates the block BLK0 as an example, but the circuit configurations of the other blocks BLK are also the same. As illustrated in FIG. 6, the block BLK0 includes four string units SU0 to SU3, for example. Each string unit SU includes a plurality of NAND strings NS.

The plurality of NAND strings NS are related to bit lines BL0 to BL(N−1) (N is an integer of 2 or more), respectively. The NAND strings NS each include, for example, memory cell transistors MC0 to MC7, and select transistors ST1 and ST2.

The memory cell transistors MC each include a control gate and a charge storage layer, and can hold data in a nonvolatile manner Hereinafter, the memory cell transistors MC0 to MC7 will be described as memory cell transistors MC, unless any of them is limited. The memory cell transistor MC may be of a MONOS type using an insulation film as a charge storage layer or may be of an FG type using a conductor layer as a charge storage layer. Hereinafter, the MONOS type will be explained as an example in the embodiment.

The select transistor ST1 is used for selecting a string unit SU at the time of the various operations. In each of the NAND strings NS, a drain of the select transistor ST1 is connected to the related one of the bit lines BL. A source of the select transistor ST1 is connected to one end of the serially connected memory cell transistors MC0 to MC7. The other end of the serially connected memory cell transistors MC0 to MC7 is connected to a drain of the select transistor ST2.

In the same block BLK, the sources of the select transistors ST2 are connected in common to a source line SL. Gates of the select transistors ST1 in the string units SU0 to SU3 are connected in common to select gate lines SGD0 to SGD3, respectively. Control gates of the memory cell transistors MC0 to MC7 are connected in common to word lines WL0 to WL7, respectively. Gates of the select transistors ST2 are connected in common to select gate lines SGS.

In the circuit configuration of the memory cell array 10 explained above, the plurality of NAND strings NS to which the same column address CA is assigned are connected in common to the same bit line BL in the plurality of blocks BLK. The source line SL is connected in common among the plurality of blocks BLK.

The circuit configuration of the memory cell array 10 included in the semiconductor device is not limited to the configuration explained above. For example, each of the number of the memory cell transistors MC, and the number of the select transistors ST1 and ST2 included in each NAND string NS may be set to an arbitrary number. The number of the string units SU included in each block BLK may be set to an arbitrary number.

Figure 7:
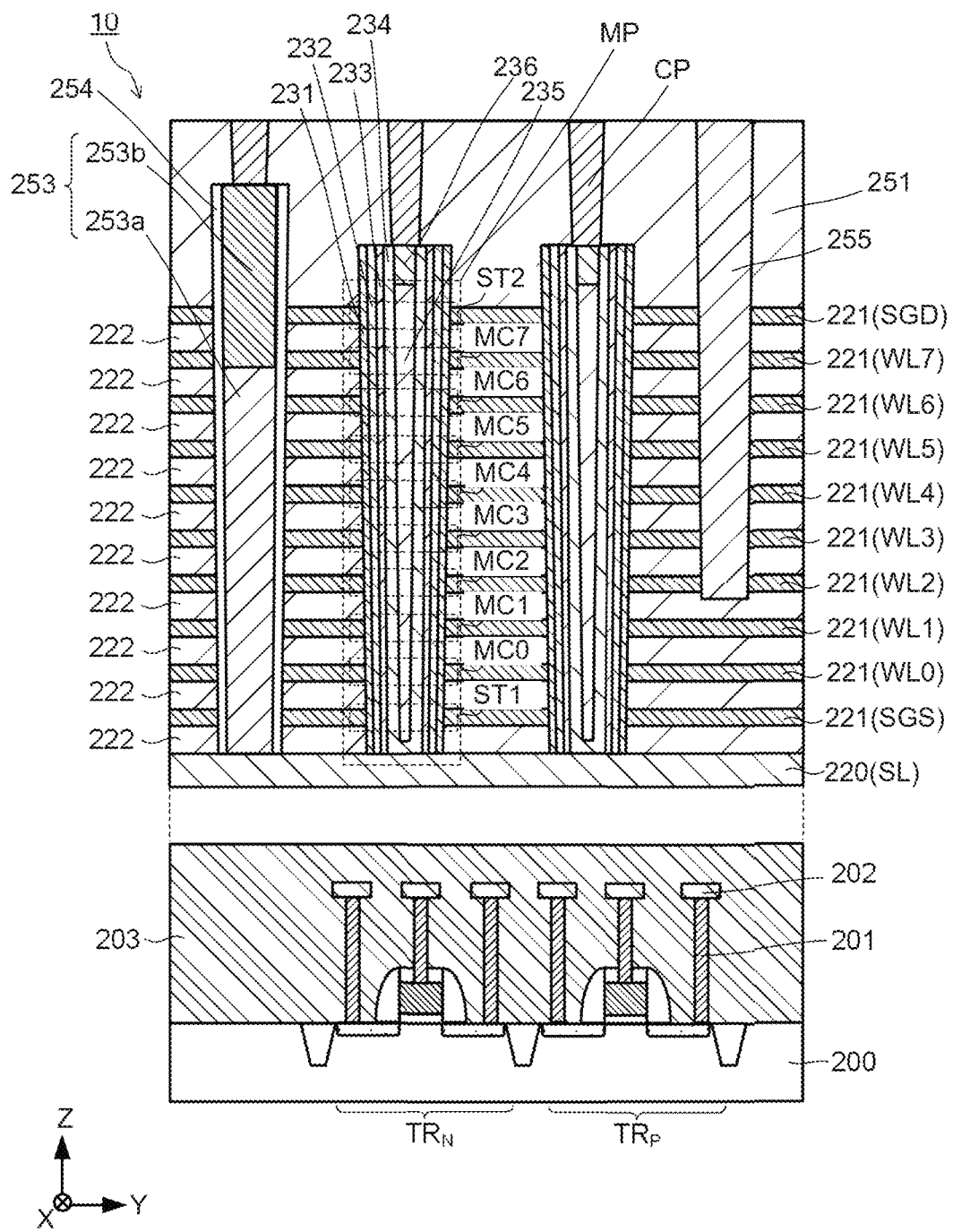
FIG. 7 is a view illustrating an example of a cross-sectional configuration of the semiconductor memory device.

Next, a cross-sectional configuration of the semiconductor memory device will be described by using FIG. 7. FIG. 7 is a view for explaining a structural example of the semiconductor memory device, and illustrates a Y-Z cross section expressed by an X-axis substantially parallel to a surface (upper surface) of a semiconductor substrate 200, a Y-axis substantially perpendicular to the X-axis, and a Z-axis substantially perpendicular to the X-axis and the Y-axis.

As illustrated in FIG. 7, an insulation layer 203 is formed on the semiconductor substrate 200. The insulation layer 203 is formed by using silicon oxide, for example. The memory cell array 10 is provided on the insulation layer 203. Peripheral circuits are formed below the memory cell array 10. In FIG. 7, a circuit region including the peripheral circuits is provided below a memory cell region including the memory cell array 10, but not limited to this, and the circuit region may also be provided so as to be arranged side by side with the memory cell region.

First, a configuration of the memory cell array 10 will be described. On the insulation layer 203, a conductive layer 220 which functions as the source line SL is provided. For example, the conductive layer 220 is formed in a plate shape provided along the X-Y plane substantially parallel to the surface (upper surface) of the semiconductor substrate 200. The conductive layer 220 is formed by using a conductive material, and an example of the conductive material includes a metal material, a semiconductor material, or the like.

On the conductive layer 220, each of a plurality of conductive layers 221 and each of a plurality of insulation layers 222 are alternately stacked. For the insulation layer 222, SiO is used, for example. The plurality of conductive layers 221 function as the select gate line SGS, the word lines WL0 to WL7, and the select gate line SGD, in the order from below, for example. For instance, the conductive layer 221 is formed in a plate shape extending in the X-axis direction. The conductive layer 221 is formed by using a conductive material, and examples of the conductive material include a metal material.

There are provided a plurality of memory pillars MP penetrating (passing through) the plurality of conductive layers 221 in the Z-axis direction and having bottom surfaces which reach the conductive layer 220. The memory pillar MP extends in the Z-axis direction. One memory pillar MP corresponds to one NAND string NS. The memory pillar MP includes a block insulation film 231, a charge storage layer 232, a tunnel insulation film 233, a semiconductor layer 234, a core insulator 235, and a cap layer 236.

More concretely, a hole corresponding to the memory pillar MP is formed by penetrating the plurality of conductive layers 221, in a manner that a bottom surface of the hole reaches the conductive layer 220. On a side surface of the hole, the block insulation film 231, the charge storage layer 232, and the tunnel insulation film 233 are stacked in order. Subsequently, the semiconductor layer 234 is formed so that its side surface is brought into contact with the tunnel insulation film 233 and its bottom surface is brought into contact with the conductive layer 220. The semiconductor layer 234 is a region in which channels of the memory cell transistors MC and the select transistors ST1 and ST2 are formed. Accordingly, the semiconductor layer 234 functions as a signal line connecting current paths of the select transistor ST2, the memory cell transistors MC0 to MC7, and the select transistor ST1. The core insulator 235 is provided on the inner side of the semiconductor layer 234. Further, on the semiconductor layer 234 and the core insulator 235, the cap layer 236 whose side surface is brought into contact with the tunnel insulation film 233 is formed.

For the block insulation film 231, the tunnel insulation film 233, and the core insulator 235, SiO is used, for example. For the charge storage layer 232, silicon nitride (SiN) is used, for example. For the semiconductor layer 234 and the cap layer 236, polysilicon is used, for example.

The memory pillar MP and the plurality of conductive layers 221 which function as the word lines WL0 to WL7, respectively, are combined to function as the memory cell transistors MC0 to MC7. In like manner, the memory pillar MP and the plurality of conductive layers 221 which function as the select gate line SGD and the select gate line SGS, respectively, are combined to function as the select transistor ST1 and the select transistor ST2.

On the cap layer 236, a contact plug CP is formed. On the contact plug CP, a conductive layer (not illustrated) which functions as a bit line BL is formed. The contact plug CP is formed by using a conductive material, and examples of the conductive material include a metal material, and so on.

In the example of FIG. 7, the memory pillars MP are arranged along the Y-axis direction, but they may be arranged in an arbitrary manner.

An insulation layer 251 is provided on a stack of the conductive layers 221 and the insulation layers 222. The insulation layer 251 contains silicon oxide formed by using tetraethylorthosilicate (TEOS), for example.

A conductive layer 253 has a function as a separator which electrically separates the word lines WL0 to WL7, the select gate line SGD, and the select gate line SGS for each group formed of a plurality of NAND strings NS. The group is also called a finger. The conductive layer 253 also has a function as a wiring (which is also referred to as a local interconnect wiring) LI connected to the source line SL. The conductive layer 253 penetrates the plurality of conductive layers 221 in the Z-axis direction to reach the conductive layer 220. The conductive layer 253 has a conductive layer 253a provided on the conductive layer 220, and a conductive layer 253b provided on the conductive layer 253a. The conductive layer 253a is formed by using a semiconductor material such as polysilicon, for example. The conductive layer 253b is formed by using a metal material such as tungsten, for example.

An insulation layer 254 is provided between the conductive layer 253 and each of the plurality of conductive layers 221. The insulation layer 254 is formed by using an insulating material such as silicon oxide, for example.

An insulation layer 255 penetrates the conductive layer 221 corresponding to the select gate line SGD in the Z-axis direction and does not penetrate the conductive layer 221 corresponding to the select gate line SGS in the Z-axis direction, out of the plurality of conductive layers 221. The insulation layer 255 has a function as a separator which electrically separates the select gate line SGD for each group formed of a plurality of NAND strings NS. The insulation layer 255 is formed by using an insulating material such as silicon oxide, for example.

The circuit region has a field-effect transistor $TR_N$ and a field-effect transistor $TR_P$. The field-effect transistor $TR_N$ and the field-effect transistor $TR_P$ can be used for the peripheral circuits such as, for example, the command register 11, the address register 12, the sequencer 13, the driver module 14, the row decoder module 15, and the sense amplifier module 16. A channel length direction of the field-effect transistor $TR_N$ and the field-effect transistor $TR_P$ is the Y-axis direction, for example, and a channel width direction of the transistors is the X-axis direction, for example.

The field-effect transistor $TR_N$ and the field-effect transistor $TR_P$ are provided below the memory cell array 10. The field-effect transistor $TR_N$ is an N-channel type transistor. The field-effect transistor $TR_P$ is a P-channel type transistor.

Each of a plurality of conductive layers 201 forms a contact plug. A plurality of conductive layers 202 form one wiring layer, and each of the conductive layers 202 forms each wiring of the aforementioned wiring layer. Each of the conductive layers 202 is connected to any of a gate, a source, and a drain of the field-effect transistor $TR_N$ or the field-effect transistor $TR_P$ via the conductive layer 201, for example. The conductive layer 201 and the conductive layer 202 contain a metal material.

The insulation layer 203 insulates between the field-effect transistor $TR_N$ and the field-effect transistor $TR_P$, between the plurality of conductive layers 201, and between the plurality of conductive layers 202, for example. The insulation layer 203 contains silicon oxide, for example. The field-effect transistor $TR_N$ and the field-effect transistor $TR_P$ are connected to the memory cell array 10 via not only the conductive layers 201 and the conductive layers 202 but also other wiring layers and contact plugs, but illustration of these will be omitted in the present embodiment for the sake of convenience.

Figure 8:
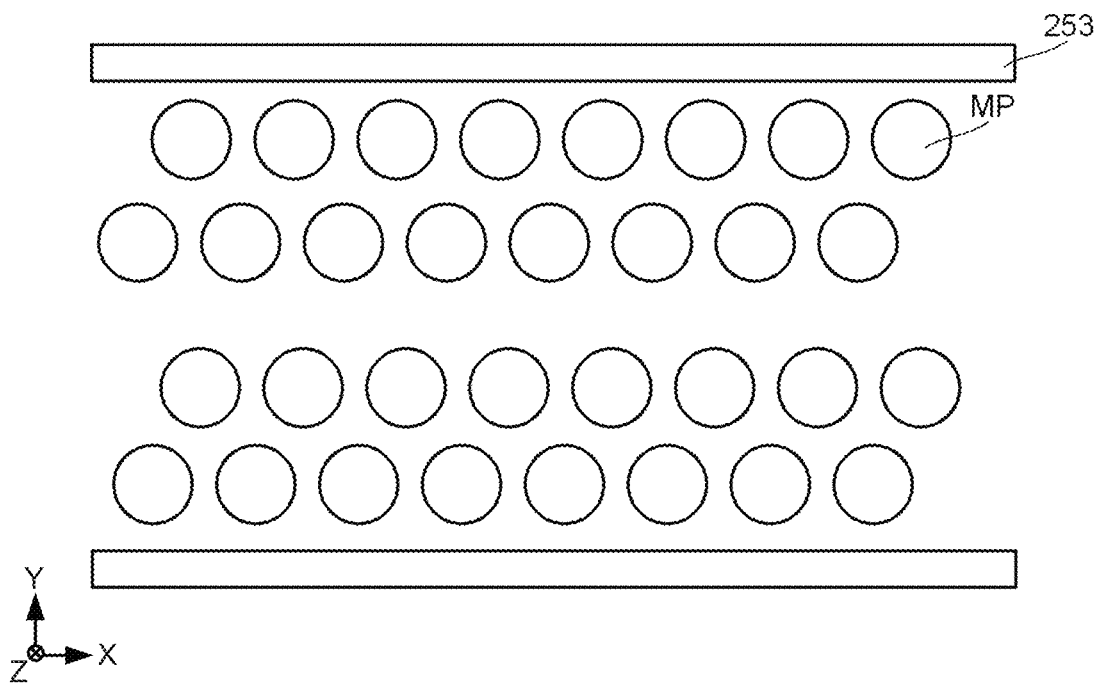
FIG. 8 is a schematic view illustrating a state of a structure before forming an insulation layer 255.
Figure 9:
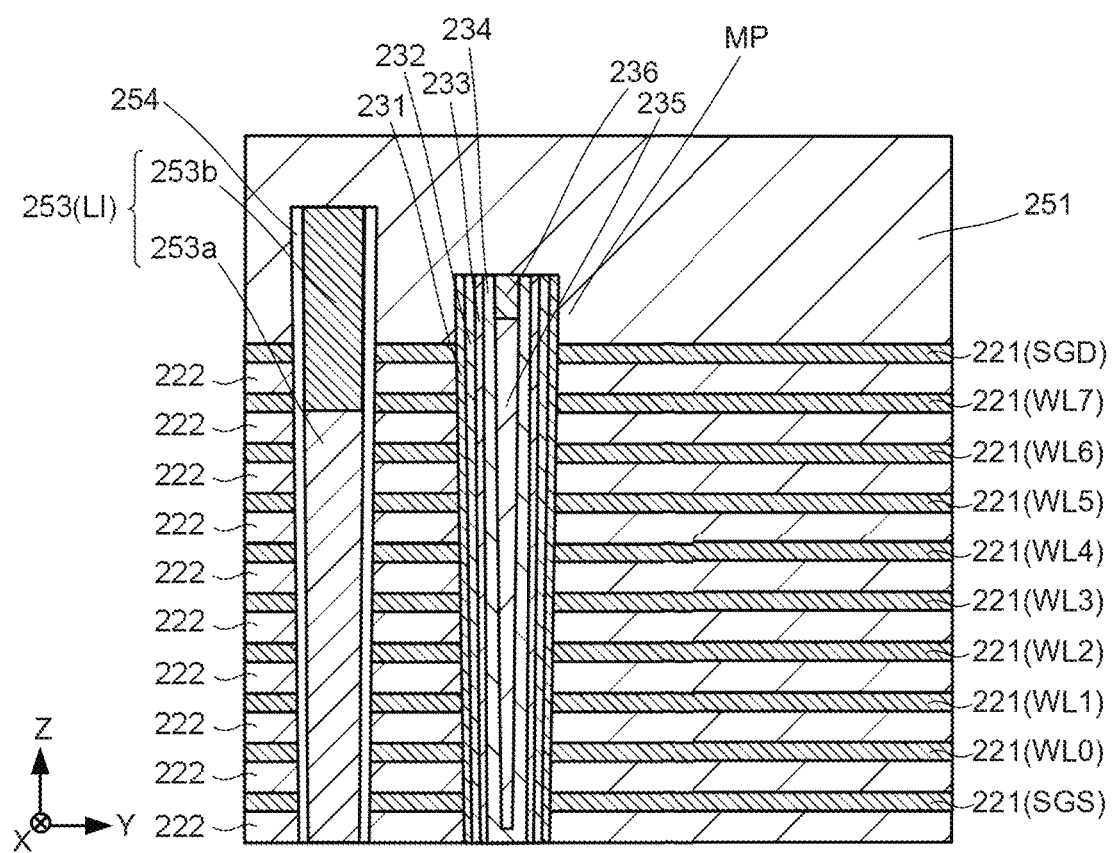
FIG. 9 is a schematic view illustrating a state of the structure before forming the insulation layer 255.

Next, an example of formation of the insulation layer 255 will be described as an example of a manufacturing method of the semiconductor memory device. Each of FIG. 8 and FIG. 9 is a schematic view illustrating a state of a structure before forming the insulation layer 255. FIG. 8 is a schematic view of X-Y plane. FIG. 9 is a schematic view of Y-Z cross section. As illustrated in FIG. 8 and FIG. 9, the memory pillars MP and the conductive layer 253 are respectively formed so as to penetrate the plurality of conductive layers 221, before forming the insulation layer 255. The memory pillars MP and the conductive layer 253 before forming the insulation layer 255 form a first pattern. This structure having the first pattern can be used for the target object 110.

Figure 10:
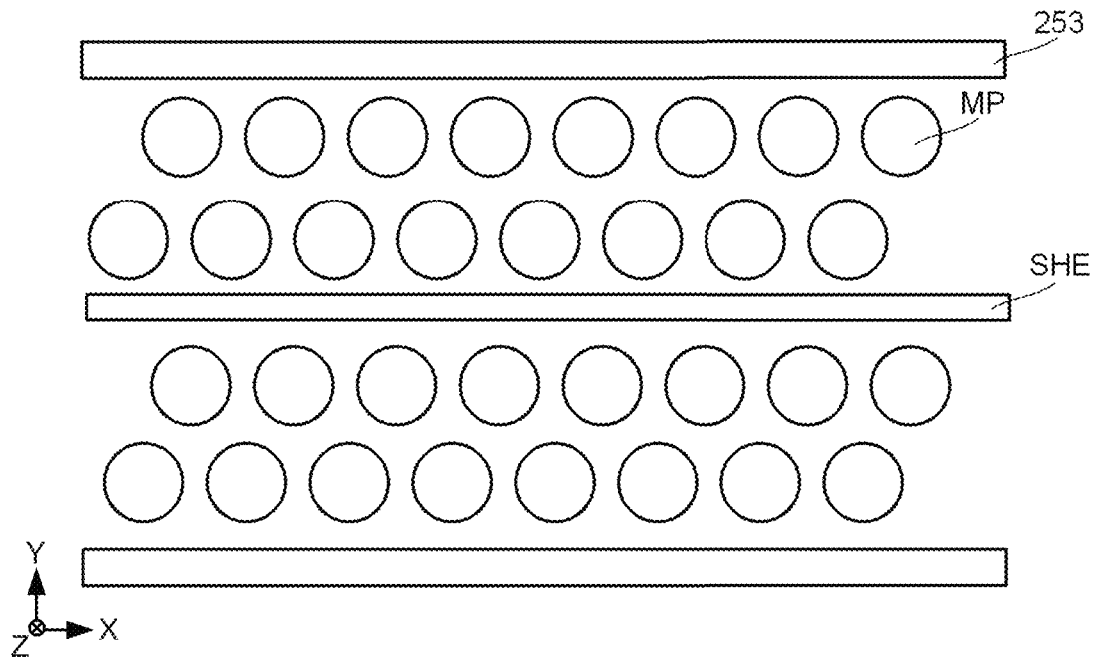
FIG. 10 is a schematic view for explaining an example of formation of the insulation layer 255.
Figure 11:
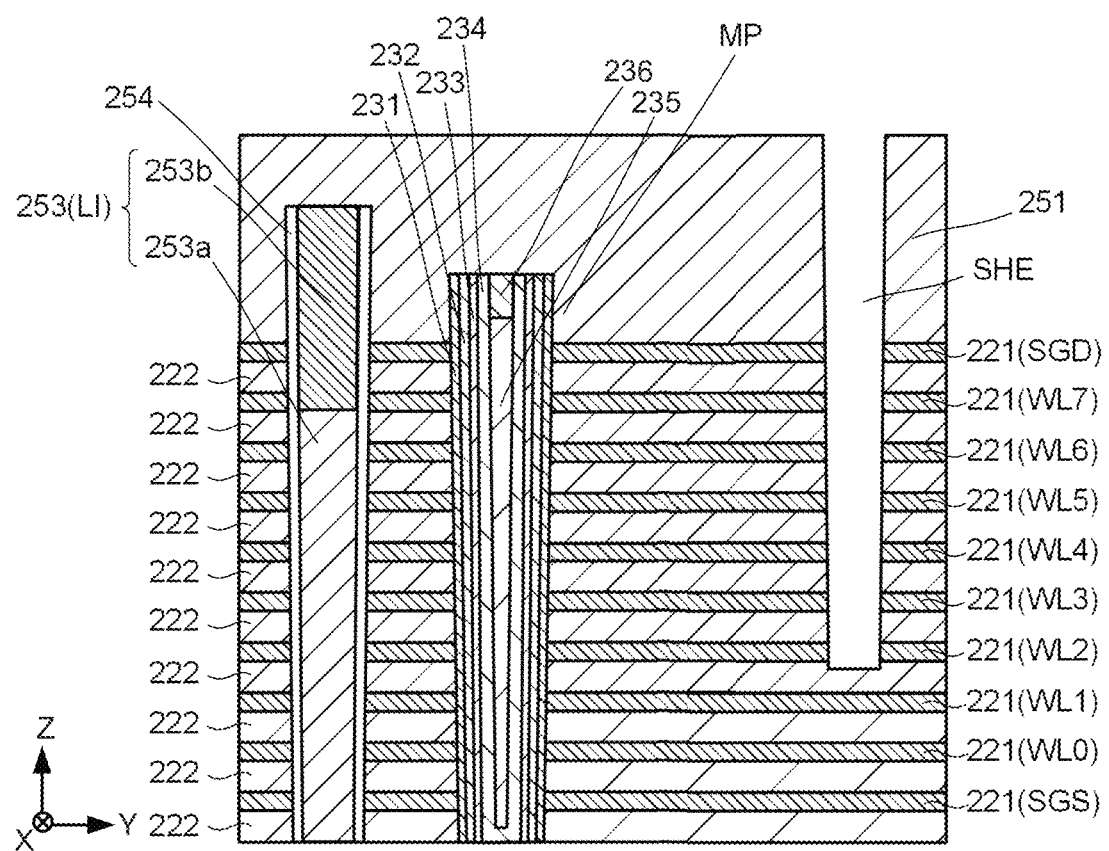
FIG. 11 is a schematic view for explaining an example of formation of the insulation layer 255.

Each of FIG. 10 and FIG. 11 is a schematic view for explaining an example of formation of the insulation layer 255. FIG. 10 is a schematic view of X-Y plane. FIG. 11 is a schematic view of Y-Z cross section. Portions illustrated in FIG. 10 and FIG. 11 are the same as the portions illustrated in FIG. 8 and FIG. 9. As illustrated in FIG. 10 and FIG. 11, before forming the insulation layer 255, a slit SHE which extends in the Z-axis direction so as to penetrate the conductive layer 221 corresponding to the select gate line SGD and not to reach the conductive layer 221 corresponding to the select gate line SGS, out of the plurality of conductive layers 221, is formed. The slit SHE can be formed by processing the conductive layers 221 and the insulation layers 222 by using etching, for example. The memory pillars MP, the conductive layer 253, and the slit SHE before forming the insulation layer 255 form a second pattern. This structure having the second pattern can be used for the target object 110. After that, the insulation layer 255 is formed so as to fill the slit SHE. The insulation layer 255 can be formed by using CVD or the like, for example.

When a positional displacement amount of the slit SHE is large and the slit SHE overlaps with the memory pillar MP in a plan view, the semiconductor memory device sometimes causes an operation failure. For this reason, it is preferable to measure and calculate how much the position of the slit SHE is displaced from a designed position, namely, it is preferable to measure and calculate a positional displacement amount, based on a position of the memory pillar MP included in the first pattern. Accordingly, a feedback correction of the position of the slit SHE can be applied in a manufacturing process of the semiconductor memory device.

Figure 12:
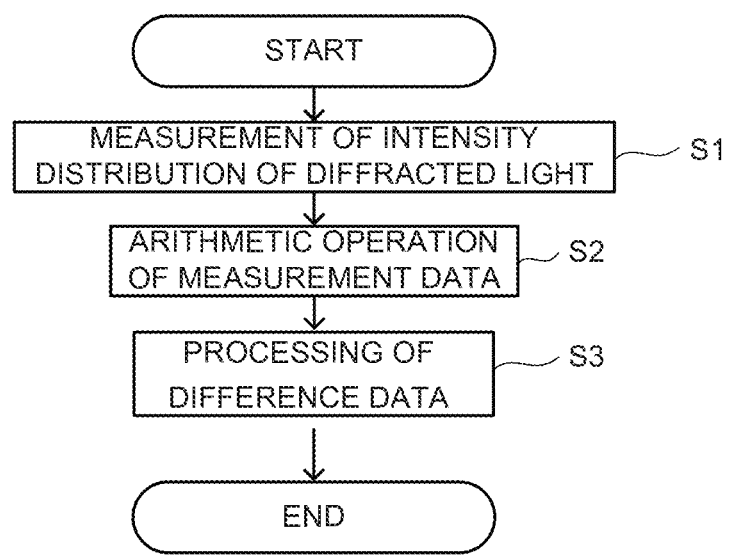
FIG. 12 is a flow chart for explaining an example of a measuring and calculating method.

Next, an example of a method of measuring and calculating a pattern positional displacement amount by using the measuring and calculating apparatus 100 will be described. FIG. 12 is a flow chart for explaining an example of the measuring and calculating method.

As illustrated in FIG. 12, the example of the measuring and calculating method includes a measuring step S1, an arithmetic step S2, and a data processing step S3. The example of the measuring and calculating method can be carried out when the control device 108 reads the control program stored in the storage unit such as the storage device 121 to make the measuring device 101, the storage device 121, and the arithmetic device 103 execute a measuring and calculating program including respective steps.

In the measuring step S1, the measuring device 101 measures a first two-dimensional intensity distribution of first diffracted light and a second two-dimensional intensity distribution of second diffracted light with the use of the imaging device 113 and via the optical system 114, the first diffracted light being generated by applying light from the light source 111 to the target object 110 after the first pattern is formed thereon and before the second pattern is formed thereon, the first pattern including the memory pillars MP and the conductive layer 253, and the second pattern including the memory pillars MP, the conductive layer 253, and the slit SHE, and the second diffracted light being generated by applying the light to the target object 110 after the second pattern is formed thereon. The respective operations of the light source 111, the stage 112, and the imaging device 113 are controlled by the control device 108. First measurement data indicating the first two-dimensional intensity distribution and second measurement data indicating the second two-dimensional intensity distribution are stored in the storage device 121. The target object 110 for measuring the second two-dimensional intensity distribution may be the same as the target object 110 after the measurement of the first two-dimensional intensity distribution, or another structure manufactured through the same manufacturing process may also be used for the target object 110.

In the case of the measuring and calculating apparatus 100 illustrated in FIG. 4, the measuring device 101 measures the first two-dimensional intensity distribution, and the measuring device 105 measures the second two-dimensional intensity distribution. The first measurement data indicating the first two-dimensional intensity distribution is stored in the storage device 121. The second measurement data indicating the second two-dimensional intensity distribution is stored in the external storage device 122. Further, the second measurement data is sent from the external storage device 122 to the storage device 121 via the data communication part 123. The measurement of the two-dimensional intensity distributions of the diffracted lights in the measuring device 101 and the measuring device 105, respectively, can perform the measuring step S1 with high efficiency.

Figure 13:
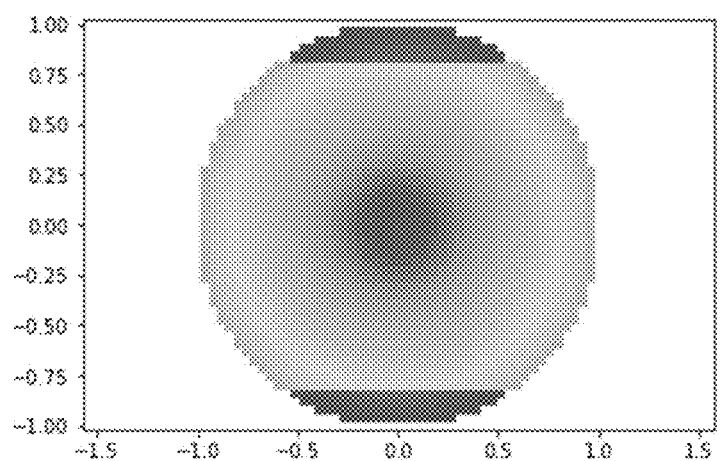
FIG. 13 is a view illustrating an example of a first two-dimensional intensity distribution.
Figure 14:
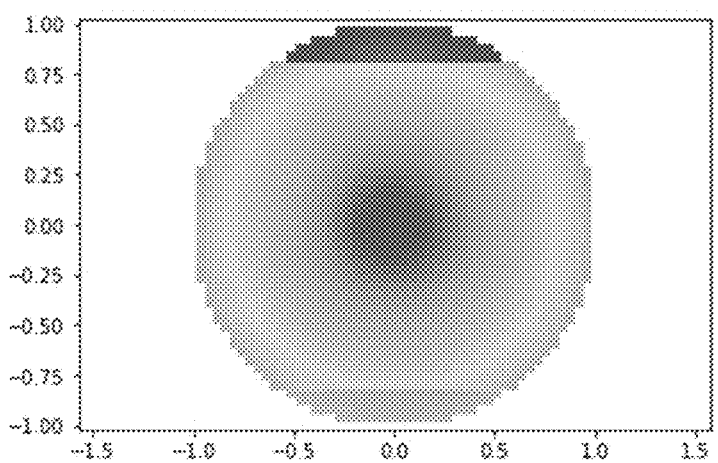
FIG. 14 is a view illustrating an example of the first two-dimensional intensity distribution.

Each of FIG. 13 and FIG. 14 is a view illustrating an example of the first two-dimensional intensity distribution. The two-dimensional intensity distribution is obtained from an intensity distribution for each pixel detected by the imaging device 113 having a plurality of pixels arranged two-dimensionally, and indicates intensities at respective XY plane coordinates of diffracted lights which are incident two-dimensionally on the imaging device 113. A horizontal axis of the view of the two-dimensional intensity distribution represents a wave number of diffracted light in the X-axis direction. A vertical axis of the view of the two-dimensional intensity distribution represents a wave number of the diffracted light in the Y-axis direction. A color gradation of the view of the two-dimensional intensity distribution represents a level of intensity. If, in a plan view, the position of the conductive layer 253 relative to the position of the memory pillar MP is exactly as designed, the first two-dimensional intensity distribution becomes a vertically symmetric one, as illustrated in FIG. 13. However, when the position of the conductive layer 253 is displaced from the designed position due to a manufacturing error caused by processing using a photolithography technique, dry etching, or the like used for forming the conductive layer 253, the first two-dimensional intensity distribution becomes a vertically asymmetric one, as illustrated in FIG. 14. It is indicated that the lower the vertically symmetric property of the two-dimensional intensity distribution, the larger the positional displacement amount of the conductive layer 253.

Figure 15:
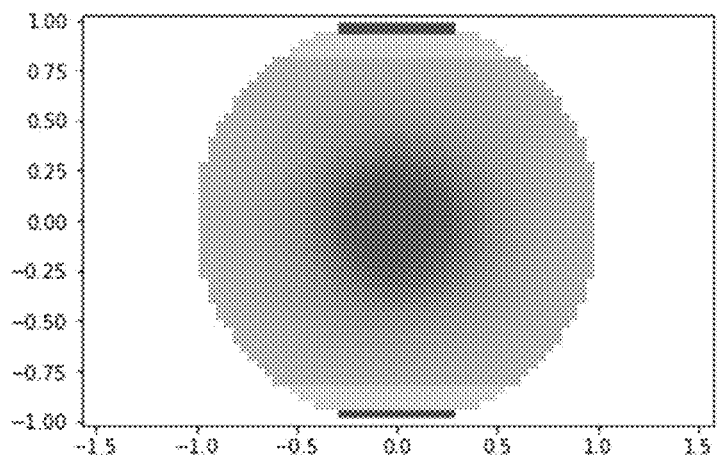
FIG. 15 is a view illustrating an example of a second two-dimensional intensity distribution.
Figure 16:
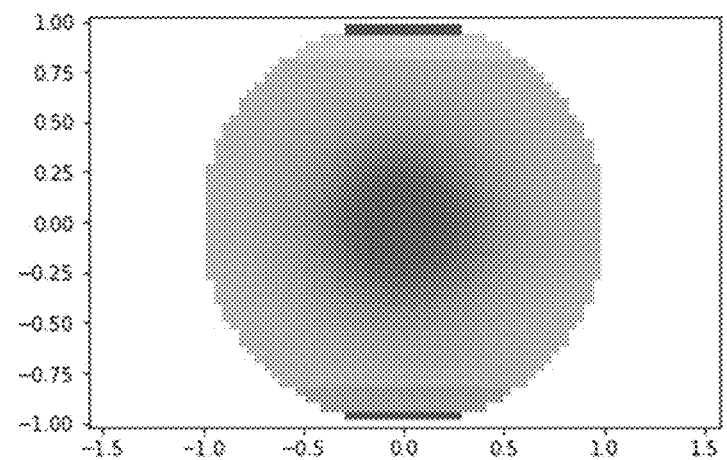
FIG. 16 is a view illustrating an example of the second two-dimensional intensity distribution.

Each of FIG. 15 and FIG. 16 is a view illustrating an example of the second two-dimensional intensity distribution. A horizontal axis of each of FIG. 15 and FIG. 16 represents a wave number of diffracted light in the X-axis direction. A vertical axis of each of FIG. 15 and FIG. 16 represents a wave number of the diffracted light in the Y-axis direction. If, in a plan view, the position of the conductive layer 253 relative to the position of the memory pillar MP and the position of the slit SHE relative to the position of the memory pillar MP are exactly as designed, the second two-dimensional intensity distribution becomes a vertically symmetric one, as illustrated in FIG. 15. However, when the position of the conductive layer 253 and the position of the slit SHE are displaced from the designed positions due to a manufacturing error caused by processing using a photolithography technique, dry etching, or the like used for forming the conductive layer 253 and the slit SHE, the second two-dimensional intensity distribution becomes a vertically asymmetric one, as illustrated in FIG. 16. It is indicated that the lower the vertically symmetric property of the two-dimensional intensity distribution, the larger the positional displacement amounts of the conductive layer 253 and the slit SHE relative to the position of the memory pillar MP. The vertically symmetric property of the second two-dimensional intensity distribution changes depending on both the positional displacement amount of the conductive layer 253 and the positional displacement amount of the slit SHE. Besides, a light application region is larger than a device pattern.

Figure 17:
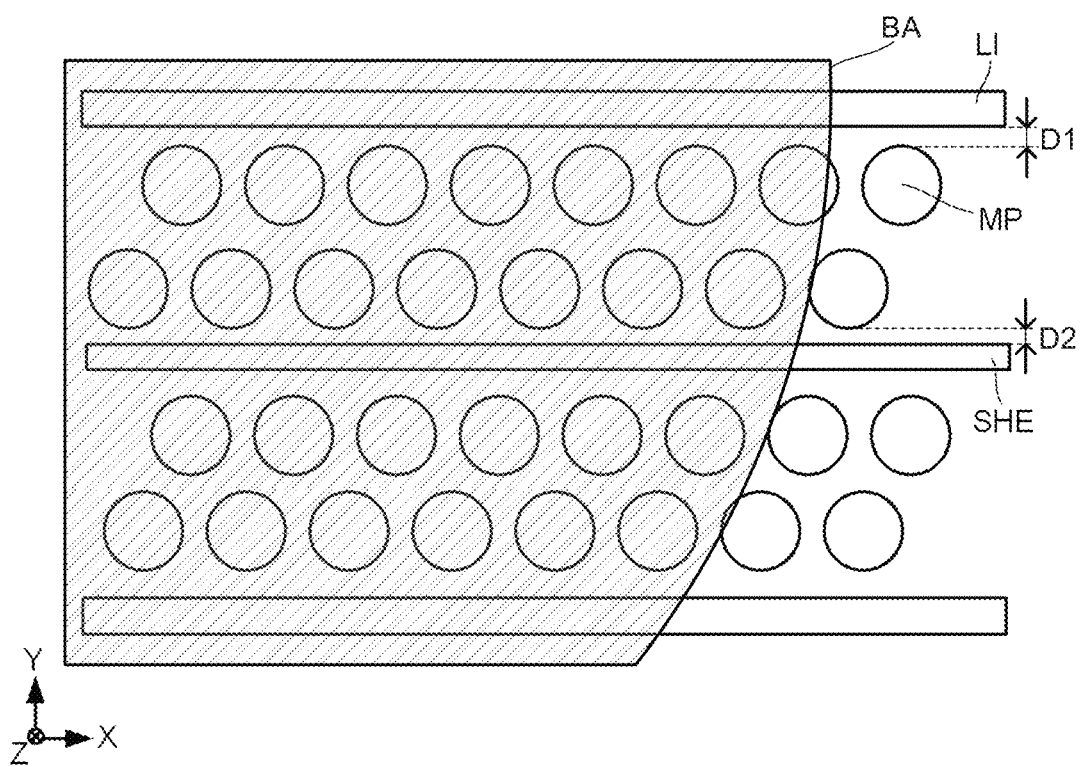
FIG. 17 is a schematic plan view illustrating a light application region.

FIG. 17 is a schematic plan view illustrating a light application region, and illustrates the memory pillars MP, the conductive layer 253, the slit SHE, and a light application region BA. The light application region BA illustrated in FIG. 17 overlaps with both the conductive layer 253 and the slit SHE. When the positional displacement amount of the conductive layer 253 is increased, an interval D1 between the conductive layer 253 and the memory pillar MP (the positional displacement amount in the Y-axis direction of the conductive layer 253 relative to the memory pillar MP) changes. When the positional displacement amount of the slit SHE is increased, an interval D2 between the slit SHE and the memory pillar MP (the positional displacement amount in the Y-axis direction of the slit SHE relative to the memory pillar MP) changes. Accordingly, it is difficult to distinguish the positional displacement amount of the conductive layer 253 from the positional displacement amount of the slit SHE based only on the second two-dimensional intensity distribution, for example, it is difficult to calculate only the positional displacement amount of the slit SHE.

In the arithmetic step S2, the arithmetic device 103 reads the first measurement data and the second measurement data stored in the storage device 121, and executes arithmetic processing using the first measurement data and the second measurement data, to thereby acquire difference data between the first measurement data and the second measurement data. An example of the arithmetic processing includes subtraction processing between the first measurement data and the second measurement data, for example.

Before the subtraction processing between the first and the second measurement data, it is possible to perform noise filter processing on the first measurement data and the second measurement data. Examples of the noise filter processing include low-pass filter processing of excluding a frequency component equal to or greater than a cut-off frequency, and so on.

When the intensity of the first measurement data and the intensity of the second measurement data are greatly different, it is also possible to perform normalization of the intensities as preprocessing of the subtraction processing, and then perform the subtraction processing. For example, it is possible to perform processing so that the intensity distribution falls within a range of −1 to 1, and an average value becomes 0. Such normalization processing can also be applied to the difference data in accordance with the necessity of data processing.

Figure 18:
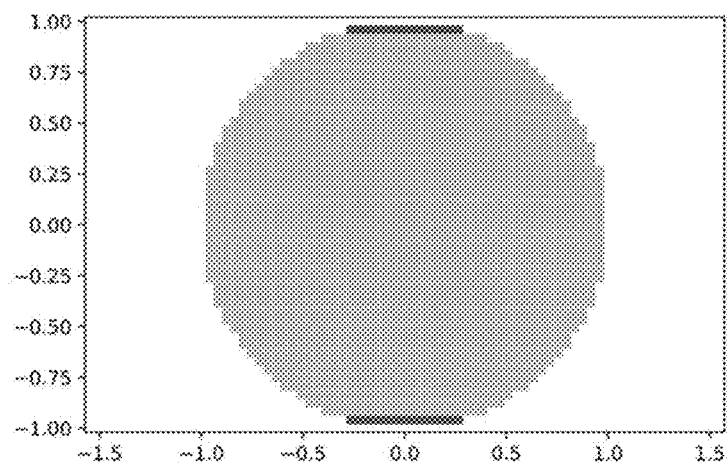
FIG. 18 is a view illustrating an example of a two-dimensional intensity distribution based on difference data.

FIG. 18 is a view of a two-dimensional intensity distribution illustrating an example of an intensity distribution based on the difference data. The intensity distribution illustrated in FIG. 18 can be obtained by executing subtraction processing between the first measurement data corresponding to the first two-dimensional intensity distribution illustrated in FIG. 14 and the second measurement data corresponding to the second two-dimensional intensity distribution illustrated in FIG. 16, for example.

Figure 19:
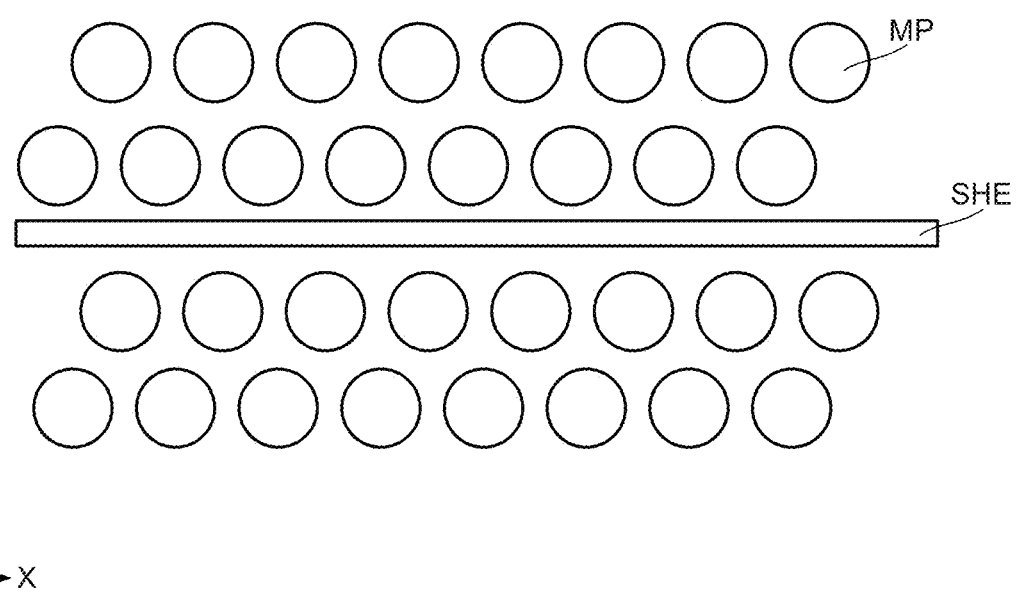
FIG. 19 is a schematic plan view illustrating an example of a difference pattern corresponding to the difference data.

FIG. 19 is a schematic plan view illustrating an example of a difference pattern corresponding to the difference data. The difference pattern illustrated in FIG. 19 corresponds to a pattern which includes the memory pillars MP and the slit SHE and which does not include the conductive layer 253. Accordingly, by acquiring the two-dimensional intensity distribution based on the difference data, it is possible to remove the change in vertically symmetric property due to the positional displacement amount of the conductive layer 253 relative to the memory pillar MP, from the second two-dimensional intensity distribution.

In the data processing step S3, the arithmetic device 103 calculates a positional displacement amount of the difference pattern based on the difference data. An example of a calculation method of the positional displacement amount of the difference pattern will be described below.

Figure 20:
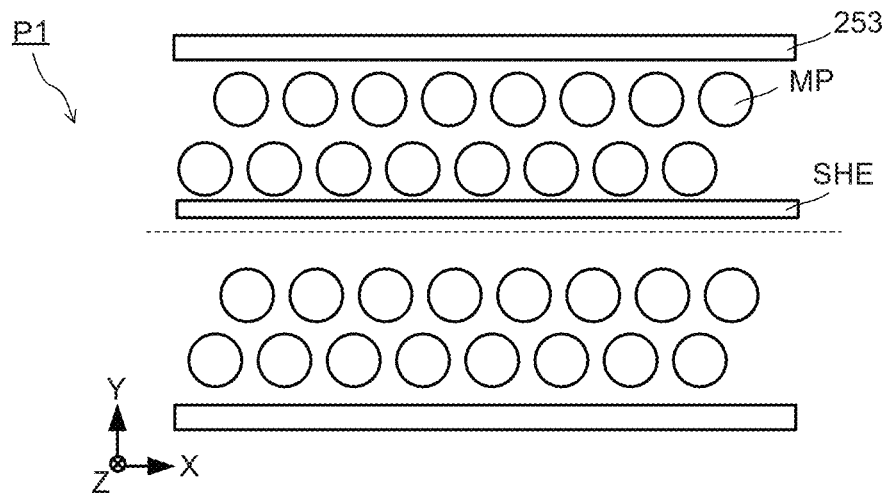
FIG. 20 is a schematic plan view illustrating an example of a pattern P1 of a comparison sample.
Figure 21:
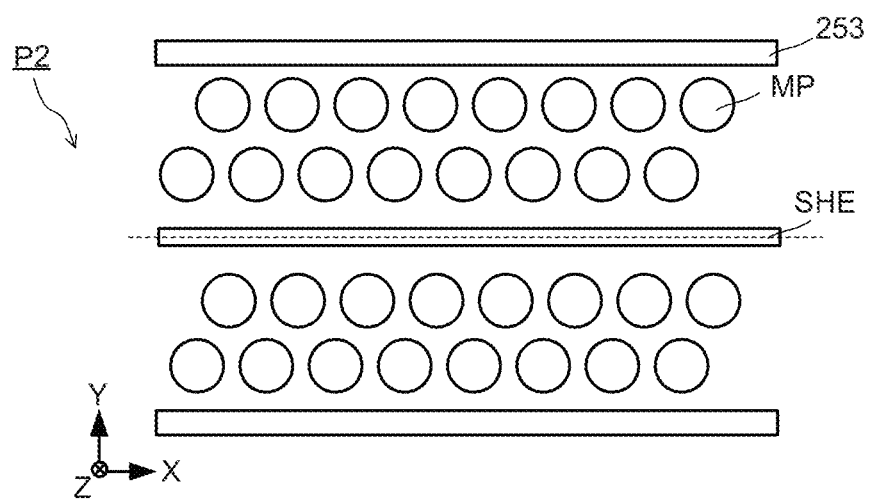
FIG. 21 is a schematic plan view illustrating an example of a pattern P2 of the comparison sample.
Figure 22:
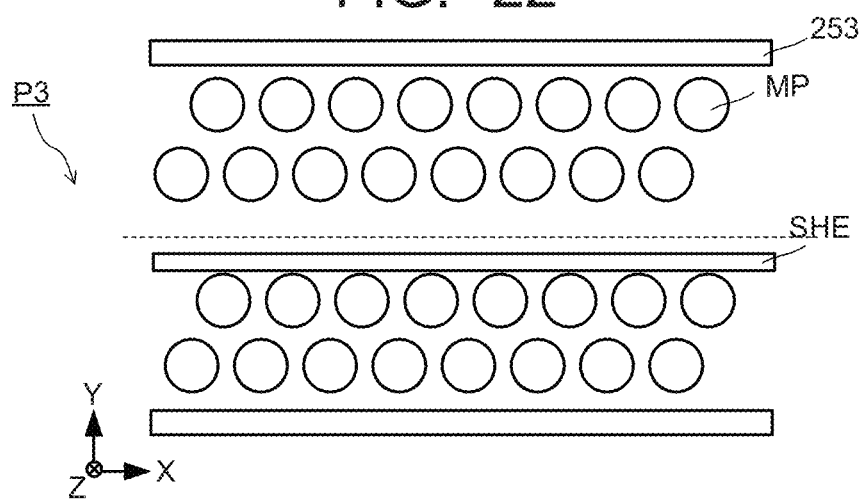
FIG. 22 is a schematic plan view illustrating an example of a pattern P3 of the comparison sample.

First, a comparison sample of a structure in which a displacement amount of the slit SHE relative to a designed position is clarified beforehand, is prepared. The structure has a pattern having the same shape as that of the target object 110. FIG. 20 to FIG. 22 are schematic plan views illustrating examples of patterns of the comparison sample. FIG. 20 illustrates a pattern P1 in which the positional displacement amount in the Y-axis direction of the formation position of the slit SHE relative to the designed position (dotted line portion) of the slit SHE is +10 nm. FIG. 21 illustrates a pattern P2 in which the positional displacement amount is ±0 nm. FIG. 22 illustrates a pattern P3 in which the positional displacement amount is −10 nm. The comparison sample has the pattern P1, the pattern P2, and the pattern P3 above one semiconductor substrate, for example.

Figure 23:
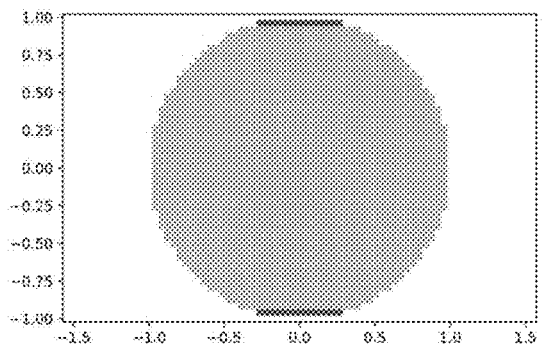
FIG. 23 is a view of a two-dimensional intensity distribution illustrating an example of an intensity distribution based on difference data of the pattern P1.
Figure 24:
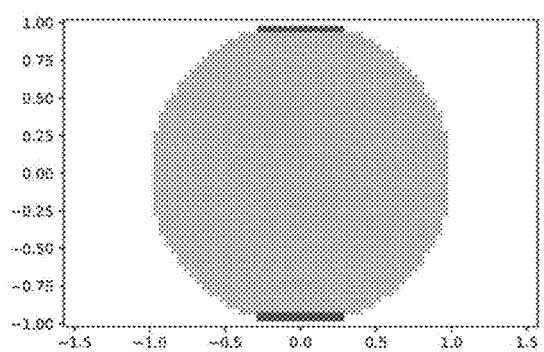
FIG. 24 is a view of a two-dimensional intensity distribution illustrating an example of an intensity distribution based on difference data of the pattern P2.
Figure 25:
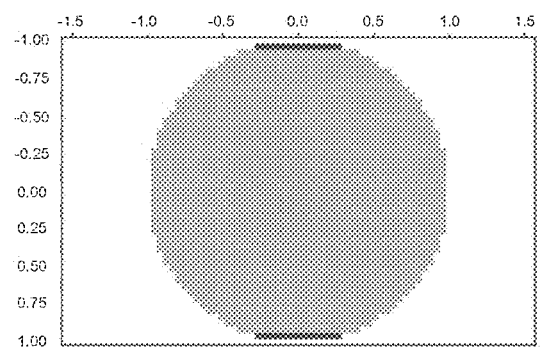
FIG. 25 is a view of a two-dimensional intensity distribution illustrating an example of an intensity distribution based on difference data of the pattern P2.

Regarding each of these patterns P1, P2, and P3, the first two-dimensional intensity distribution and the second two-dimensional intensity distribution are measured beforehand, and the arithmetic operation is performed to acquire the difference data, similarly to the target object 110. FIG. 23 is a view of a two-dimensional intensity distribution illustrating an example of an intensity distribution based on the difference data of the pattern P1. FIG. 24 is a view of a two-dimensional intensity distribution illustrating an example of an intensity distribution based on the difference data of the pattern P2. FIG. 25 is a view of a two-dimensional intensity distribution illustrating an example of an intensity distribution based on the difference data of the pattern P2. A horizontal axis of each of FIG. 23 to FIG. 25 represents a wave number of diffracted light in the X-axis direction. A vertical axis of each of FIG. 23 to FIG. 25 represents a wave number of the diffracted light in the Y-axis direction.

Figure 26:
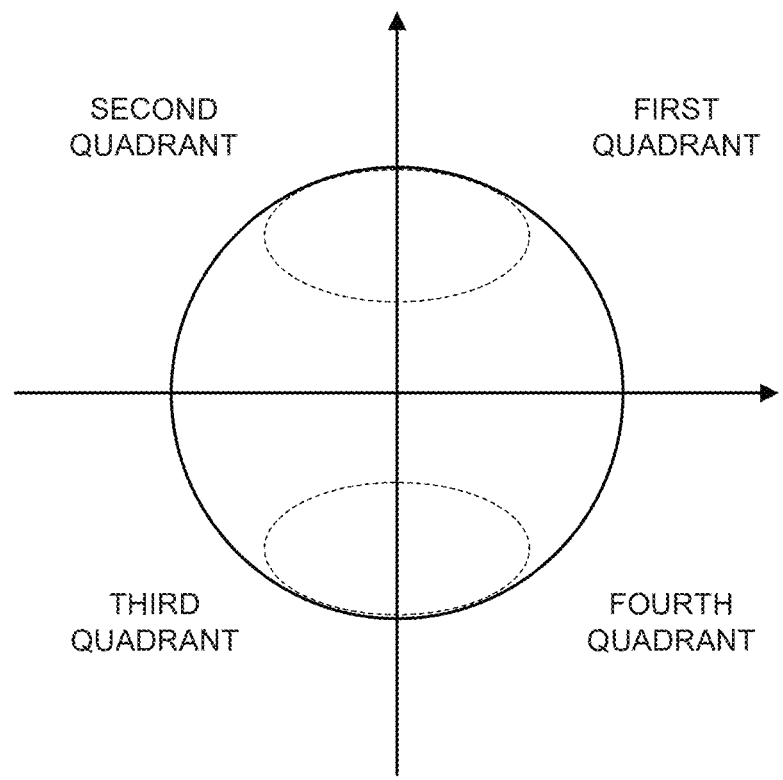
FIG. 26 is a schematic view of a two-dimensional intensity distribution for explaining a calculation method of an asymmetric component.

Next, in the view of the two-dimensional intensity distribution based on each difference pattern, difference data between an upper intensity distribution and a lower intensity distribution is acquired, to thereby calculate an asymmetric component. FIG. 26 is a schematic view of a two-dimensional intensity distribution for explaining the calculation method of the asymmetric component. The asymmetric component has a value obtained by dividing the two-dimensional intensity distribution into a first quadrant, a second quadrant, a third quadrant, and a fourth quadrant, and subtracting an intensity average value of the third quadrant and the fourth quadrant (lower intensity distribution) from an intensity average value of the first quadrant and the second quadrant (upper intensity distribution).

Figure 27:
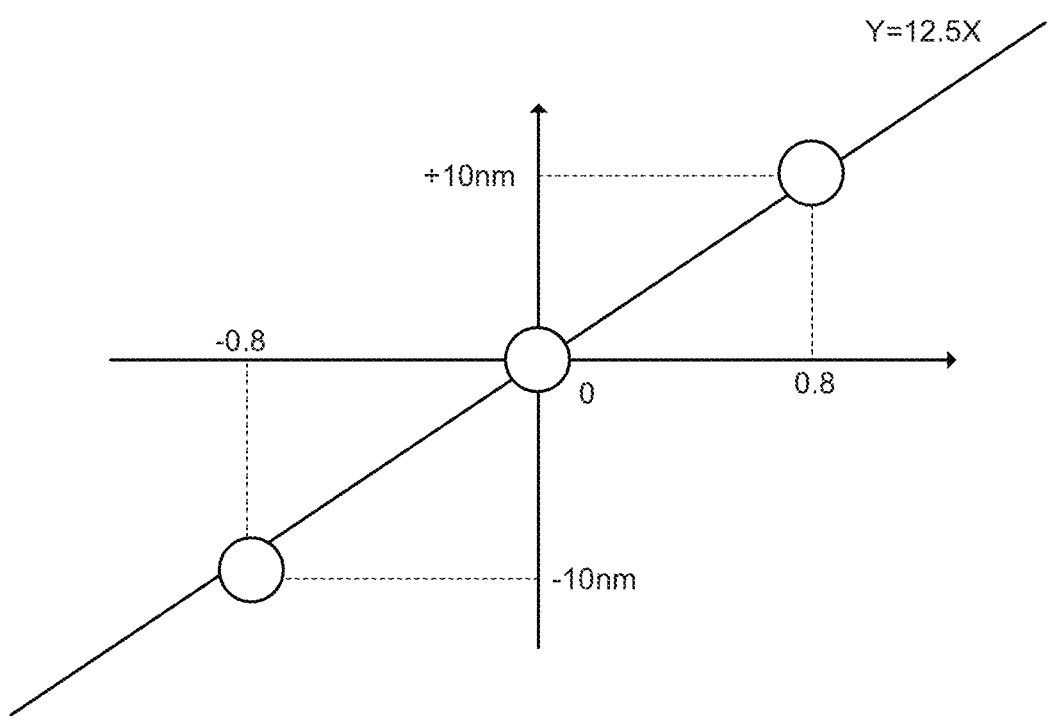
FIG. 27 is a schematic view illustrating an example of a model equation M.

Next, linear regression is performed in which the positional displacement amount in the Y-axis direction is set to an objective variable and the asymmetric component is set to an explanatory variable, to thereby create a model equation M: Y=F(X) of the positional displacement amount. FIG. 27 is a schematic view illustrating an example of the model equation M. For example, when the asymmetric component in the pattern P1 is −0.8, the asymmetric component in the pattern P2 is 0.0, and the asymmetric component in the pattern P3 is +0.8, the model equation M is represented by Y=12.5X. The model equation M is not limited to the linear regression model, and it is also possible to use a Partial Least Squares (PLS) model or a complicated model such as a neural network.

After that, an asymmetric component of the difference data of the target object 110 is also acquired by the same method. Next, by substituting the acquired value of the asymmetric component into Y in the model equation M: Y=12.5X, it is possible to calculate the positional displacement amount in the Y-axis direction. For example, when the asymmetric component is −0.6, it can be confirmed that the positional displacement amount in the Y-axis direction is −7.5 nm. Data of the calculated positional displacement amount may be then output to the outside of the measuring and calculating apparatus 100.

As described above, in the method of measuring and calculating the pattern positional displacement amount by using the measuring and calculating apparatus of the present embodiment, by measuring, for each of a plurality of manufacturing processes, the two-dimensional intensity distribution of diffracted light according to the pattern formed on the target object, and executing the arithmetic processing using the pieces of measurement data to acquire the difference data, it is possible to extract only the two-dimensional intensity distribution of the pattern to be measured and calculated, resulting in that the calculation accuracy of the positional displacement amount of the desired pattern can be improved.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measuring and calculating apparatus configured to measure and calculate a positional displacement amount of a pattern on a surface of a target object, the apparatus comprising:

a measuring unit comprising at least one measuring device comprising a light source configured to apply light and an imaging device comprising an image sensor configured to receive light, the at least one measuring device being configured to (I) control the light source to apply a light to the target object after a first pattern is formed thereon and before a second pattern is formed thereon to thereby generate first diffracted light, to receive the generated first diffracted light using the image sensor, and to measure a first two-dimensional intensity distribution of the received first diffracted light, and (II) control the light source to apply the light to the target object after the first pattern and the second pattern are formed thereon to thereby generate second diffracted light, to receive the generated second diffracted light using the image sensor, and to measure a second two-dimensional intensity distribution of the received second diffracted light, wherein the first pattern has a first object pattern and a second object pattern, and the second pattern has the first object pattern, the second object pattern, and a third object pattern;

a storage unit comprising at least one storage device comprising at least one of a hard disk drive and a solid state drive, the at least one storage device being configured to store a first measurement data and a second measurement data, the first measurement data indicating the first two-dimensional intensity distribution, and the second measurement data indicating the second two-dimensional intensity distribution; and an arithmetic unit comprising a computer configured to execute arithmetic processing using the first measurement data and the second measurement data to acquire a difference data between the first measurement data and the second measurement data, and calculate a positional displacement amount of a difference pattern between the first and second patterns in accordance with the difference data, the difference pattern having the first object pattern and the third object pattern and not having the second object pattern.

2. The apparatus according to claim 1, wherein:
the at least one measuring device of the measuring unit comprises:
a first measuring device comprising a first light source and a first imaging device including a first image sensor, the first measuring device being configured to measure the first two-dimensional intensity distribution of the first diffracted light, the first diffracted light being received by the first image sensor, the first diffracted light being generated by controlling the first light source to apply the light to the target object after the first pattern is formed thereon and before the second pattern is formed thereon; and a second measuring device comprising a second light source and a second imaging device including a second image sensor, the second measuring device being configured to measure the second two-dimensional intensity distribution of the second diffracted light, the second diffracted light being received by the second image sensor, the second diffracted light being generated by controlling the second light source to apply the light to the target object after the first pattern and the second pattern are formed thereon; and the storage unit comprises:

a first storage device comprising at least one of a first hard disk drive and a first solid state drive, the first storage device being configured to store the first measurement data; and a second storage device comprising at least one of a second hard disk drive and a second solid state drive, the second storage device being configured to store the second measurement data.

3. The apparatus according to claim 2, wherein
the arithmetic processing includes subtraction processing between the first and the second measurement data.

4. The apparatus according to claim 1, wherein
the arithmetic processing includes subtraction processing between the first and the second measurement data.

5. A non-transitory computer-readable storage medium having stored thereon a computer-executable program that is executable by a computer of a measuring and calculating apparatus for measuring and calculating a positional displacement amount of a pattern on a surface of a target object, wherein the measuring and calculating apparatus comprises a measuring unit comprising at least one measuring device which includes a light source configured to apply light and an imaging device comprising an image sensor configured to receive light, wherein the program is executable by the computer to control the computer to perform functions comprising:

(I) controlling the light source to apply a light to the target object after a first pattern is formed thereon and before a second pattern is formed thereon to thereby generate first diffracted light, receiving the generated first diffracted light using the image sensor, and measuring a first two-dimensional intensity distribution of the received first diffracted light, and (II) controlling the light source to apply the light to the target object after the first pattern and the second pattern are formed thereon to thereby generate second diffracted light, receiving the generated second diffracted light using the image sensor, and measuring a second two-dimensional intensity distribution of the received second diffracted light, wherein the first pattern has a first object pattern and a second object pattern, and the second pattern has the first object pattern, the second object pattern, and a third object pattern;

executing arithmetic processing using a first measurement data and a second measurement data to acquire difference data between the first measurement data and the second measurement data, the first measurement data indicating the first two-dimensional intensity distribution, the second measurement data indicating the second two-dimensional intensity distribution; and calculating a positional displacement amount of a difference pattern between the first and second patterns in accordance with the difference data, the difference pattern having the first object pattern and the third object pattern and not having the second object pattern.

6. The non-transitory computer-readable storage medium according to claim 5, wherein
the arithmetic processing includes subtraction processing between the first measurement data and the second measurement data.

* * * * *